(12) United States Patent
Burt (10) Patent No.: US 6,538,503 B2
(45) Date of Patent: Mar. 25, 2003

(54) INSTRUMENTATION AMPLIFIER AND METHOD FOR OBTAINING HIGH COMMON MODE REJECTION

(75) Inventor: Rodney T Burt, Tucson, AZ (US)

(73) Assignee: Texas Instruments Incorporated, Dallas, TX (US)

(*) Notice: Subject to any disclaimer, the term of this patent is extended or adjusted under 35 U.S.C. 154(b) by 44 days.

(21) Appl. No.: 09/790,951

(22) Filed: Feb. 22, 2001

(65) Prior Publication Data

US 2002/0113651 A1 Aug. 22, 2002

(51) Int. Cl.[7] .............................. H03F 1/02; H03F 3/45
(52) U.S. Cl. ........................ 330/9; 330/258; 330/257
(58) Field of Search ........................ 330/9, 257, 258; 327/124, 307

(56) References Cited

U.S. PATENT DOCUMENTS

| | | | |
|---|---|---|---|
| 4,232,271 A | 11/1980 | Dobkin et al. | 330/258 |
| 4,833,422 A | 5/1989 | Atwell | 330/254 |
| 5,075,633 A | 12/1991 | Bowers | 330/69 |
| 5,276,405 A | 1/1994 | Mazzucco et al. | 330/257 |
| 5,444,363 A * | 8/1995 | Cabler | 323/315 |
| 5,880,638 A * | 3/1999 | Schaffer | 330/261 X |
| 6,262,626 B1 * | 7/2001 | Bakker et al. | 330/9 |

OTHER PUBLICATIONS

*Novel Current–Mode Instrumentation Amplifier*, Technical Paper, Electronics Letters, Feb. 2, 1989, vol. 25, No. 3, pp 228–230.

*Low Noise, Precision Instrumentation Amplifier*, Technical Paper, Analog Devices, Inc., 1998, pp 1–22.

\* cited by examiner

*Primary Examiner*—Steven J. Mottola
(74) *Attorney, Agent, or Firm*—Snell & Wilmer (57) ABSTRACT

An instrumentation amplifier is provided which can provide high common mode rejection without the use of precision resistors. The instrumentation amplifier can be configured in an 8-pin layout, such as, for example, for an MSOP-8 or SO-8 surface mount package. In addition, an instrumentation amplifier can be provided which can effectively cancel the differential mode signal created by common mode input signals, such as those caused by parasitic capacitance and the like. As a result, the instrumentation amplifier can exhibit excellent AC as well as DC common mode rejection. In accordance with an exemplary embodiment, an instrumentation amplifier can comprise two pairs of current mirrors configured with two buffers to suitably add the differential current-mode signals and subtract the common current mode signals of each buffer to thereby cancel the differential mode signal created by common mode input signals, such as those caused by the parasitic capacitances within the instrumentation amplifier. Further, the buffers and current mirrors can be can be chopper stabilized to further enhance the operation of the instrumentation amplifier. Still further, an instrumentation amplifier can be configured to provide rail-to-rail voltage swing capability for input, output and/or reference terminals. In accordance with an exemplary embodiment, an instrumentation amplifier can include a pair of charge pumps which are configured to provide supply voltage to the buffers and current mirrors. In addition, the pair of charge pumps can comprise a positive charge pump and a negative charge pump which can provide an additional voltage beyond the supply voltage, thus facilitating rail-to-rail voltage swing capabilities for input, output and/or reference terminals.

28 Claims, 4 Drawing Sheets

INSTRUMENTATION AMPLIFIER AND METHOD FOR OBTAINING HIGH COMMON MODE REJECTION

FIELD OF THE INVENTION

The present invention relates to instrumentation amplifier circuits. More particularly, the present invention relates to an instrumentation amplifier configured to obtain high common mode rejection.

BACKGROUND OF THE INVENTION

The demand for improved instrumentation amplifier circuits for high-precision data acquisition and instrumentation applications, such as multi-channel data acquisition systems, current shunt monitors, and industrial or physiological sensors, continues to increase. Instrumentation amplifier circuits are generally designed to amplify the difference between two voltage inputs with a defined gain, wherein a single-ended output is provided which is referenced to a known reference point, for example, ground.

Figure 1:
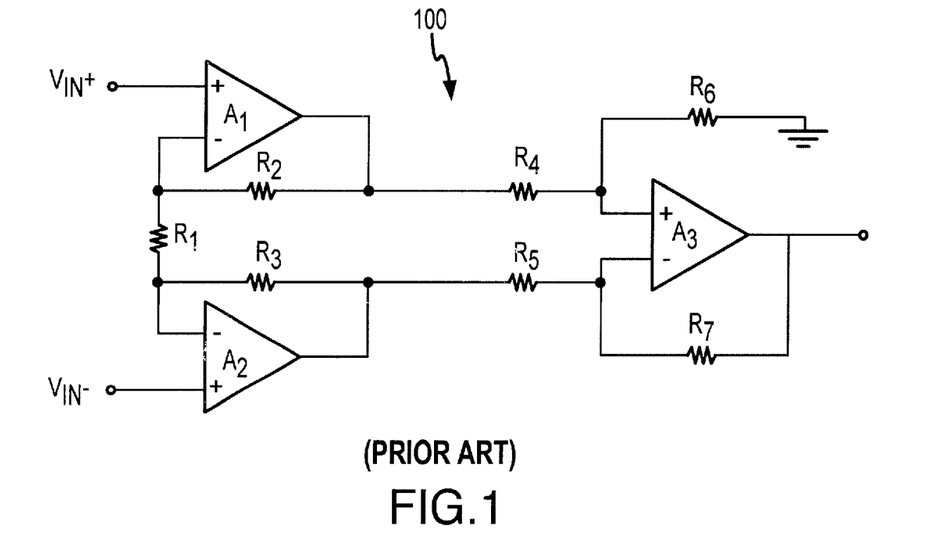
FIG. 1 illustrates a schematic diagram of a prior art three op amp instrumentation amplifier.

There are a variety of instrumentation amplifier circuits available today. One conventional instrumentation amplifier comprises three op-amps as illustrated in FIG. 1. Instrumentation amplifier 100 comprises two op amps, $A_1$ and $A_2$, which operate as "gain cells" and are suitably connected together so that a differential input signal is applied to the positive inputs of the two op amps, while the outputs of the two op amps are applied as a differential input to a third op amp, $A_3$, that is connected as a difference amplifier. In addition, instrumentation amplifier 100 is generally configured to be linear and have a well-defined gain. To achieve high common mode rejection (CMR), instrumentation amplifier 100 requires the precise matching of resistors R4 through $R_7$. This matching requirement is undesirable because the extremely precise matching of resistors with high manufacturing yields can be difficult and expensive to achieve.

Figure 2:
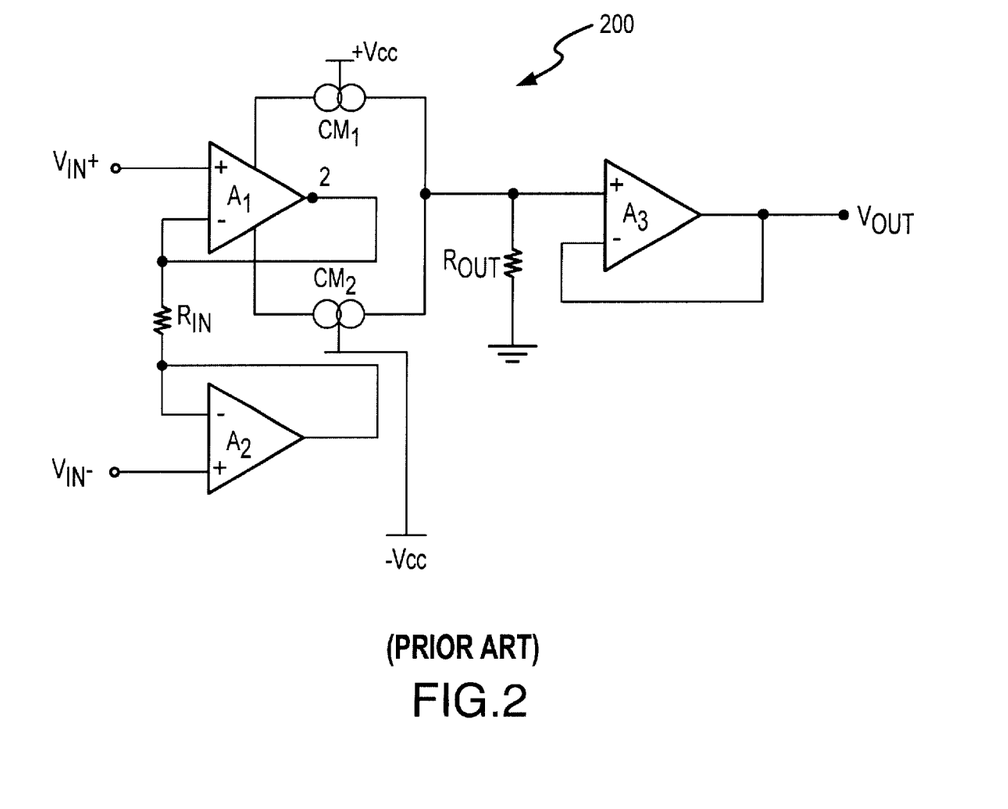
FIG. 2 illustrates a schematic diagram of another prior art three op amp instrumentation amplifier.

One approach for an instrumentation amplifier which does not require precision resistors to achieve high DC common mode rejection is disclosed by Toumazou and Lidgey in "Novel Current-Mode Instrumentation Amplifier", *Electronics Letters*, Vol. 25 No. 3, Feb. 2, 1989, and is illustrated in FIG. 2. Instrumentation amplifier 200 comprises a three op-amp configuration wherein unity gain buffers $A_1$ and $A_2$ are each comprised of an op amp and an output stage circuit. Unity gain buffers $A_1$ and $A_2$ are configured to receive a differential input voltage $V_{IN}$, i.e., the difference between input voltages $V_{IN}+$ and $V_{IN}-$, at the positive input terminals and create a current mode signal through resistor $R_{IN}$ equal to $V_{IN}/R_{IN}$. This current mode signal is supplied from the difference in supply currents from the unity gain buffer $A_1$. In addition, instrumentation amplifier 200 includes current mirrors $CM_1$ and $CM_2$ which are configured to mirror the supply currents from both the op amp and the output stage circuit of unity gain buffer $A_1$, the $V_{IN}^+$ unity gain buffer. Only the difference in supply currents, $V_{IN}/R_{IN}$, flows out of the output of current mirrors $CM_1$ and $CM_2$ and into resistor $R_{OUT}$. As a result, a voltage is developed equal to $V_{IN} \times (R_{OUT}/R_{IN})$ that can be buffered through unity gain buffer $A_3$ to the output terminal $V_{OUT}$.

This instrumentation amplifier configuration can provide good DC common mode rejection since only differential signals are passed to the output unity gain buffer $A_3$. However, any AC load current to ground occurring at the negative input terminal of unity gain buffer $A_1$ will be realized as a differential signal and will result in poor AC common mode rejection. This CMR error is a result of the parasitic capacitance $C_{par2}$ from the wiring connections and inherent parasitics in resistor $R_{IN}$, as well as the input and output stage capacitance of unity gain buffer $A_1$. This parasitic capacitance $C_{par2}$, can create significant degradation in AC common mode rejection at frequencies as low as 60 Hz. Further, this CMR error with respect to the parasitic capacitance $C_{par2}$ at node 2 can be expressed as $V_{OUT} = V_{CM} \times (s \times R_{OUT} \times C_{par2})$.

While other approaches have been disclosed for providing an instrumentation amplifier without precision resistors for providing high DC and AC common mode rejection, these configurations are more complex in design. For example, some of these instrumentation amplifiers include significantly more terminals, such as 18-lead or 20-lead pin configurations. These configurations differ greatly from a more desirable 8-pin configuration, for example, MSOP-8 or SO-8 surface mount packages being preferred.

Another limitation associated with currently available instrumentation amplifiers is the impact of supply voltages. For example, currently available instrumentation amplifiers have great difficulty in providing for large voltage swing capability for input terminals. While it would be highly desirable if these instrumentation amplifiers could provide rail-to-rail voltage swing capabilities, currently available instrumentation amplifiers cannot suitably provide true rail-to-rail voltage swing due to their operating characteristics.

Accordingly, a need exists for an instrumentation amplifier which can provide good AC and DC common mode rejection. In addition, a need exists for an instrumentation amplifier which can provide a very desirable 8-pin configuration to facilitate more desirable package design. Further, a need exists for an instrumentation amplifier configured to provide rail-to-rail voltage swing capability at input, output and reference terminals.

SUMMARY OF THE INVENTION

The method and circuit according to the present invention addresses many of the shortcomings of the prior art. In accordance with one aspect of the present invention, an instrumentation amplifier is provided which can provide high common mode rejection without the use of precision resistors. In addition, the instrumentation amplifier can be configured in an 8-pin layout, such as, for example, for an MSOP-8 or SO-8 surface mount package. Moreover, the external gain setting circuits can be configured in various arrangements.

In accordance with another aspect of the present invention, an instrumentation amplifier can be provided which can effectively cancel the differential mode signal created by common mode input signals, such as caused by parasitic capacitances and the like which are detrimental to AC common mode rejection. Accordingly, an exemplary instrumentation amplifier is provided that can exhibit excellent AC as well as DC common mode rejection. In accordance with an exemplary embodiment, an instrumentation amplifier can comprise two pairs of current mirrors configured with two buffers to suitably add the differential current-mode signals and subtract the common current-mode signals of each buffer to thereby cancel the differential mode signal created by common mode input signals, such as those that may be created from the parasitic capacitances within the instrumentation amplifier. In accordance with another exemplary embodiment, the buffers and/or current mirrors can be can be chopper stabilized to further enhance the operation of the instrumentation amplifier.

In accordance with another aspect of the present invention, an instrumentation amplifier can be configured to provide rail-to-rail voltage swing capabilities at the input, output and/or reference terminals. Rail-to-rail voltage swing means to or beyond the power supply rails for inputs, and proximate to the power supply rails for outputs, for example, within approximately 100 mV. In accordance with an exemplary embodiment, an instrumentation amplifier can include a pair of charge pumps which are configured to provide supply voltage to the buffers and current mirrors. In addition, the pair of charge pumps can comprise a positive charge pump and a negative charge pump which can provide an additional voltage beyond the supply voltage, thus facilitating rail-to-rail voltage swing capabilities at the input, output and/or reference terminals.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

The present invention may be described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. In addition, the present invention may be practiced in any integrated circuit application. Such general applications that may be appreciated by those skilled in the art in light of the present disclosure are not described in detail herein. However for purposes of illustration only, exemplary embodiments of the present invention will be described herein in connection with instrumentation amplifiers. Further, it should be noted that while various components may be suitably coupled or connected to other components within exemplary circuits, such connections and couplings can be realized by direct connection between components, or by connection through other components and devices located therebetween.

As discussed above, prior art instrumentation amplifiers have great difficulty in providing high CMR without providing complex package designs or costly manufacturing methods to provide precision internal resistors. For example, some instrumentation amplifier circuits utilizing external resistors are configured for 18-pin or 20-pin packages. Other instrumentation amplifiers may provide for fewer pin connections, but require costly manufacturing methods to provide precision internal resistors to achieve good DC common mode rejection. However, in accordance with one aspect of the present invention, an instrumentation amplifier has been developed which can provide high CMR without the use of precision resistors, and that can be realized through a more desirable 8-pin package layout.

Figure 3A:
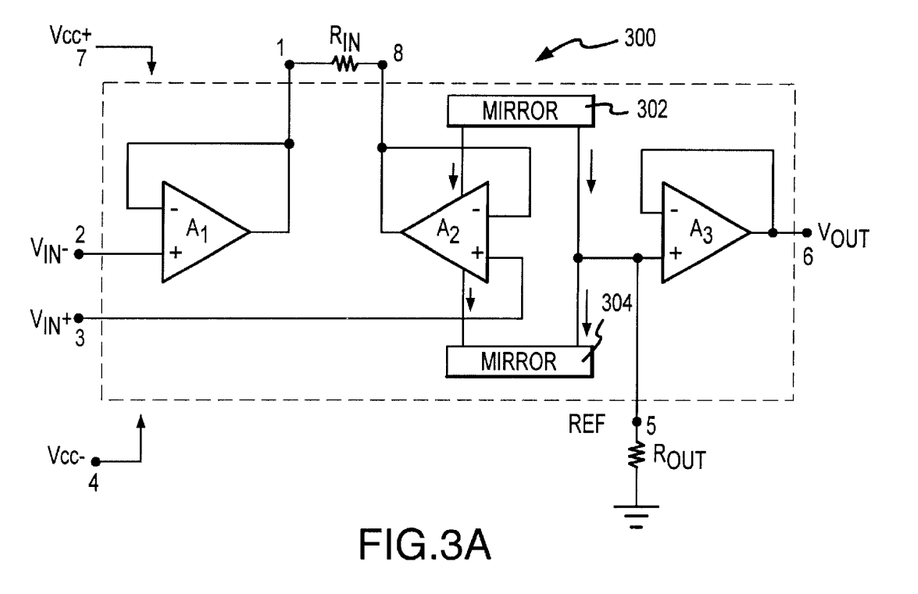
FIGS. 3A and 3B illustrate schematic diagrams of an instrumentation amplifier in accordance with exemplary embodiments of the present invention.

With reference to FIG. 3A, in accordance with an exemplary embodiment, an instrumentation amplifier 300 comprises a three op-amp configuration with external gain setting resistors which can provide a more desirable 8-pin layout for circuit designers and achieve high DC common mode rejection. Instrumentation amplifier 300 suitably comprises buffers $A_1$ and $A_2$ which are configured to receive a differential input voltage $V_{IN}$, i.e., the difference between input voltages $V_{IN}+$ and $V_{IN}-$, at input terminals 2 and 3. Buffers $A_1$ and $A_2$ are configured to create a current mode signal through an external resistor $R_{IN}$ proportional to the input voltage $V_{IN}$, e.g., a current signal equal to $V_{IN}/R_{IN}$. Buffers $A_1$ and $A_2$ can comprise various buffer types with various gain configurations, for example, unity gain buffers, or buffers with less than or greater than unity gain.

In addition, instrumentation amplifier 300 suitably includes current mirrors 302 and 304 which are configured to mirror the supply current sensed from buffer $A_2$ at terminal 5. Further, the difference in supply currents, $V_{IN}/R_{IN}$, is configured to flow out of terminal 5 and into an external gain resistor $R_{OUT}$. As a result, a voltage is developed at terminal 5 equal to $V_{IN} \times (R_{OUT}/R_{IN})$ that can be buffered through buffer $A_3$ to output terminal 6.

Instrumentation amplifier 300 does not require the use of expensive precision resistors, but rather can utilize less expensive, lower precision resistor components and achieve high DC common mode rejection. External resistors $R_{IN}$ and $R_{OUT}$ are suitably configured for gain setting of instrumentation amplifier 300. Further, only eight pins may be utilized in accordance with the exemplary configuration. As a result, instrumentation amplifier 300 can be configured in more desirable packages, such as, for example, MSOP-8 or SO-8 surface mount packages, or other desired 8-pin packages.

Figure 4A:
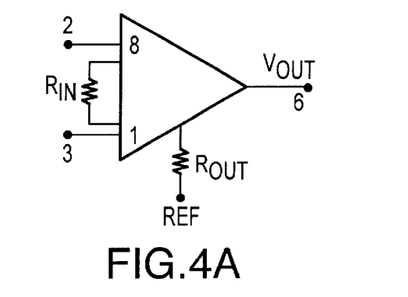
FIGS. 4A through 4C illustrate schematic diagrams of exemplary gain configuration circuits in accordance with the present invention.
Figure 4B:
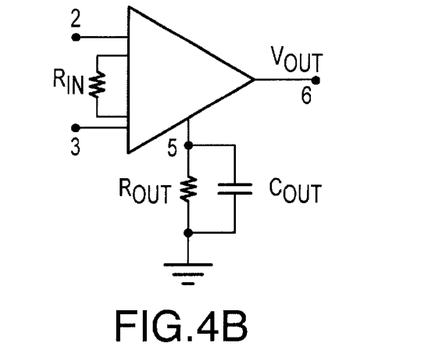

In addition, the gain setting circuit for instrumentation amplifier 300 can comprise various other external arrangements. For example, with reference to FIG. 4A, in addition to an external resistor $R_{OUT}$, instrumentation amplifier 300 can comprise an adjustable reference REF. In addition, with reference to FIG. 4B, instrumentation amplifier 300 can comprise an output filtering configuration including an external resistor $R_{OUT}$ and an external capacitor $C_{OUT}$ configured in a parallel arrangement, with the capacitor $C_{OUT}$ comprising, for example, a 10 pf capacitor that is configured to reduce noise.

Figure 4C:
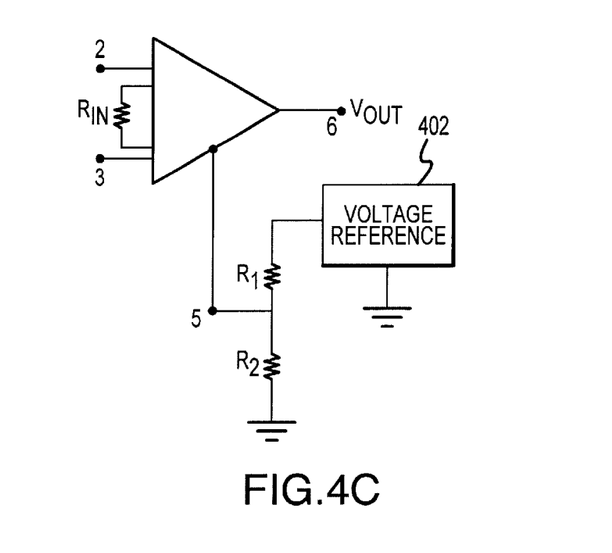

Still further, with reference to FIG. 4C, instrumentation amplifier 300 can comprise an offsetting output configuration including external resistors $R_1$ and $R_2$ configured in a voltage dividing arrangement and a voltage reference 402. External resistors $R_1$ and $R_2$ can comprise various ranges of values while voltage reference 402 can provide any suitable external voltage source for providing an offset voltage. As a result, the output voltage $V_{OUT}$ at terminal 6 comprises $(V_{REF} \times (R2/(R1+R2))) + (V_{IN} \times (R_1 \times R_2)/((R_1+R_2) \times R_{IN}))$. Thus, the external gain setting configuration can comprise various arrangements depending on any number of design criteria.

Accordingly, regardless of the external gain setting configuration utilized, instrumentation amplifier 300 can be configured in an 8-pin configuration, for example, with two pins configured for the input voltages $V_{IN}+$ and $V_{IN}-$, two pins configured for the power supply VCC (positive and negative terminals), two pins configured for external resistor $R_{IN}$, a single pin for the external gain setting resistor $R_{OUT}$, or other gain setting configuration, and a single pin for the output terminal $V_{OUT}$. Moreover, the novel 8-pin configuration can be implemented with various other instrumentation amplifier arrangements as will be described below.

While the above instrumentation amplifier can provide high CMR through a desirable 8-pin layout, in accordance with another aspect of the present invention, an instrumentation amplifier can be provided which exhibits excellent AC common mode rejection as well as DC common mode rejection. In accordance with this aspect, an instrumentation amplifier is provided which can effectively cancel the differential mode signal created by common mode input signals, such as caused by parasitic capacitances and other capacitance effects as described above.

Figure 5:
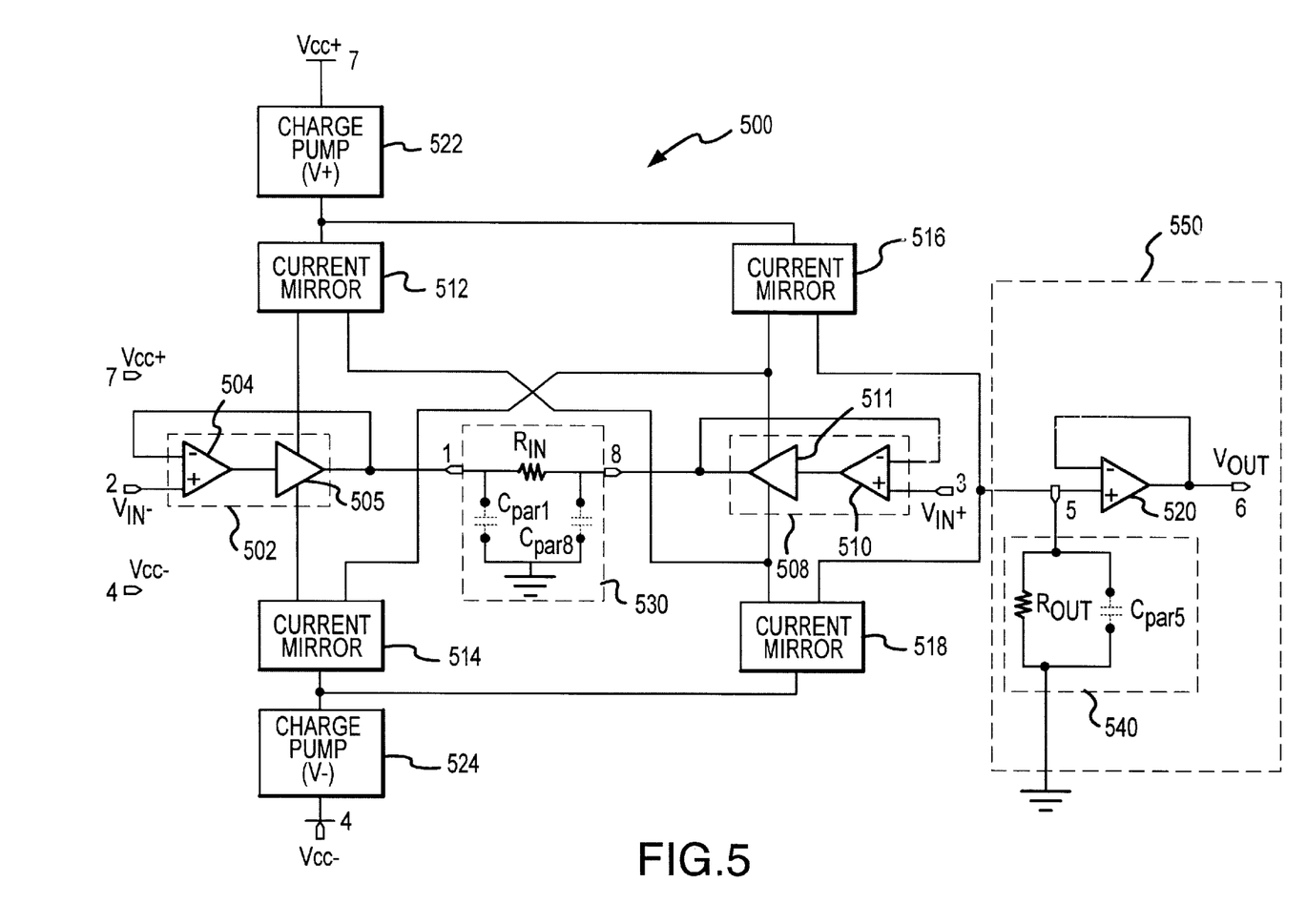
FIG. 5 illustrates a schematic diagram of another exemplary embodiment of an instrumentation amplifier in accordance with the present invention.

With reference to FIG. 5, an exemplary instrumentation amplifier 500 suitably comprises a two-op amp configuration including buffers 502 and 508, an input resistor $R_{IN}$, and two pairs of current mirrors comprising a first pair of current mirrors 512 and 514 and a second pair of current mirrors 516 and 518. Buffers 502 and 508 are configured to create a current mode signal through external resistor $R_{IN}$ proportional to the input voltage $V_{IN}$. In accordance with an exemplary embodiment, buffer 502 comprises an op amp 504 and an output stage 505 while buffer 508 comprises an op amp 510 and an output stage 511. In addition, buffers 502 and 508 are suitably configured to provide substantially the same input and output behavior characteristics. This similarity can be readily facilitated since buffers 502 and 508 can be fabricated on the same die or chip during manufacture.

Input resistor $R_{IN}$ can suitably comprise various resistor components and configurations having various resistor values, for example, from 1K ohm or less to 500K ohms or more. In addition, instrumentation amplifier 500 does not require the use of expensive precision resistors, but rather can utilize less expensive, lower precision resistor components and achieve high DC common mode rejection.

To facilitate the providing of high AC common mode rejection, instrumentation amplifier 500 suitably includes current mirrors 512 and 514 in addition to current mirrors 516 and 518. Current mirrors 512 and 514 are configured to mirror the supply current sensed from buffer 502 while current mirrors 516 and 518 are configured to mirror the supply current sensed from buffer 508. In addition, current mirrors 512 and 514 and current mirrors 516 and 518 are configured to add the differential current-mode signals and subtract the common current-mode signals of buffers 502 and 508. In the exemplary embodiment, the inputs of current mirrors 512 and 514 are suitably connected to the supply terminals of buffer 502 while the outputs of current mirrors 512 and 514 are suitably connected to the input terminals of current mirrors 516 and 518. In accordance with other exemplary embodiments, current mirrors 512 and 514 could be suitably connected to the output of buffer 508. In addition, current mirrors 512 and 514 and current mirrors 516 and 518 comprise a pair of transistors having an area that may be suitably increased or otherwise scaled to improve the matching characteristics while maintaining compliance voltage and noise gain. While current mirrors 512, 514, 516 and 518 can be configured in various arrangements, in accordance with an exemplary embodiment, current mirrors 512, 514, 516 and 518 can also be chopper stabilized to reduce DC errors.

As a result, the summed current mode signal is essentially double the amount of current flowing through resistor $R_{IN}$ than that current derived from a single pair of current mirrors as described above in conjunction with the embodiments illustrated in FIG. 3. The summed current mode signal that flows out of terminal 5 can be configured to provide an output current signal, or can be configured with an output resistor to provide an output voltage signal. More importantly, however, instrumentation amplifier 500 is configured to effectively cancel the differential mode signal created by common mode input signals, such as caused by parasitic capacitances and other capacitance effects.

For example, as described above, without this cancellation, CMR error can result from the parasitic capacitance from the wiring connections and inherent parasitics in resistor $R_{IN}$, as well as the input and output stage capacitance of buffer 508. Further, the parasitic capacitance and other capacitance components can create significant degradation in AC common mode rejection at frequencies as low as 60 Hz. Thus, instrumentation amplifier 500 includes a parasitic component $C_{par1}$ associated with external resistor $R_{IN}$ that appears at terminal 1, as well as capacitance effects associated with op amp 504 and output stage 505 and a parasitic component $C_{par8}$ associated with external resistor $R_{IN}$ that appears at terminal 8, as well as capacitance effects associated with op amp 510 and output stage 511.

However, instrumentation amplifier 500 can effectively cancel out the detrimental effects of, for example, parasitic components $C_{par1}$ and $C_{par8}$, in that buffers 502 and 508 can have substantially identical characteristics as a result of being fabricated on the same chip and thus can be suitably matched, i.e., the input capacitance of op amp 504 and the capacitance of output stage 505 operate to effectively cancel their respective capacitance counterparts for op amp 510 and output stage 511. For example, if instrumentation amplifier 500 is configured with an output buffer configuration 550, the output voltage for common mode signals will be $V_{OUT}=V_{CM}\times(s\times R_{OUT}\times(C_{par8}-C_{par1}))$. As a result of the effective cancellation of the parasitic and other capacitance effects for external resistor $R_{IN}$, as seen at terminals 1 and 8, the AC common mode rejection can be improved significantly over the prior art instrumentation amplifiers. Moreover, by further controlling the external parasitics, such as external wiring and the like, instrumentation amplifier 500 can provide excellent AC and DC common mode rejection.

Further, in addition to providing high AC and DC common mode rejection, instrumentation amplifier 500 does not require the use of expensive precision resistors, but rather can utilize less expensive, lower precision resistor components and achieve high DC common mode rejection. In addition, the external resistor arrangement allows instrumentation amplifier 500 to only require an 8-pin configuration which is very desirable for package design and layout.

As discussed above instrumentation amplifier 500 can be configured for providing an output current signal at terminal 5 to other integrated circuit components, for example, to other amplifier circuits, analog-to-digital converters, or other like devices. In addition, instrumentation amplifier 500 can also be suitably configured with an output buffer configuration to provide an output voltage signal $V_{OUT}$.

In accordance with an exemplary embodiment, with continued reference to FIG. 5, an output buffer configuration 550 comprises an output buffer 520 and an output resistor $R_{OUT}$. In accordance with this embodiment, output buffer 520 suitably comprises various amplifier configurations for buffering the voltage present at terminal 5 to provide the output voltage $V_{OUT}$ at terminal 6. In the exemplary embodiment, output buffer 520 also comprises a unity gain buffer. Output buffer 520 can also comprise various other configurations, e.g., output buffer 520 can be chopper stabilized to address offset, drift and other DC errors.

External resistor $R_{OUT}$ suitably comprises various resistor components and configurations having various resistor values, for example, from 1K ohm or less to 500K ohms or more. In addition, external resistor $R_{OUT}$ can suitably comprise inexpensive resistor types, for example, small chip scale resistors, and achieve high DC common mode rejection.

Further, external gain resistors $R_{IN}$ and $R_{OUT}$ can be configured to provide a suitable gain setting for instrumentation amplifier 500. For example, external gain resistors $R_{IN}$ and $R_{OUT}$ can be configured to provide a gain of less than unity, or greater than unity, such as from 0.1V/V or less to 10,000V/V or more.

During operation of instrumentation amplifier 500 with output buffer configuration 550, the summed current mode signal flows out of terminal 5 into external resistor $R_{OUT}$ to provide an output voltage $V_{OUT}=V_{IN}\times 2\times(R_{OUT}/R_{IN})$. Thus for example, for an exemplary embodiment in which $R_{OUT}$ has a resistor value ½ of the value of resistor $R_{IN}$, e.g., $R_{OUT}$=50K ohms and $R_{IN}$=100K ohms, then $V_{OUT}=V_{IN}$. In addition, other gain variations can be implemented in accordance with various other exemplary embodiments.

Figure 3B:
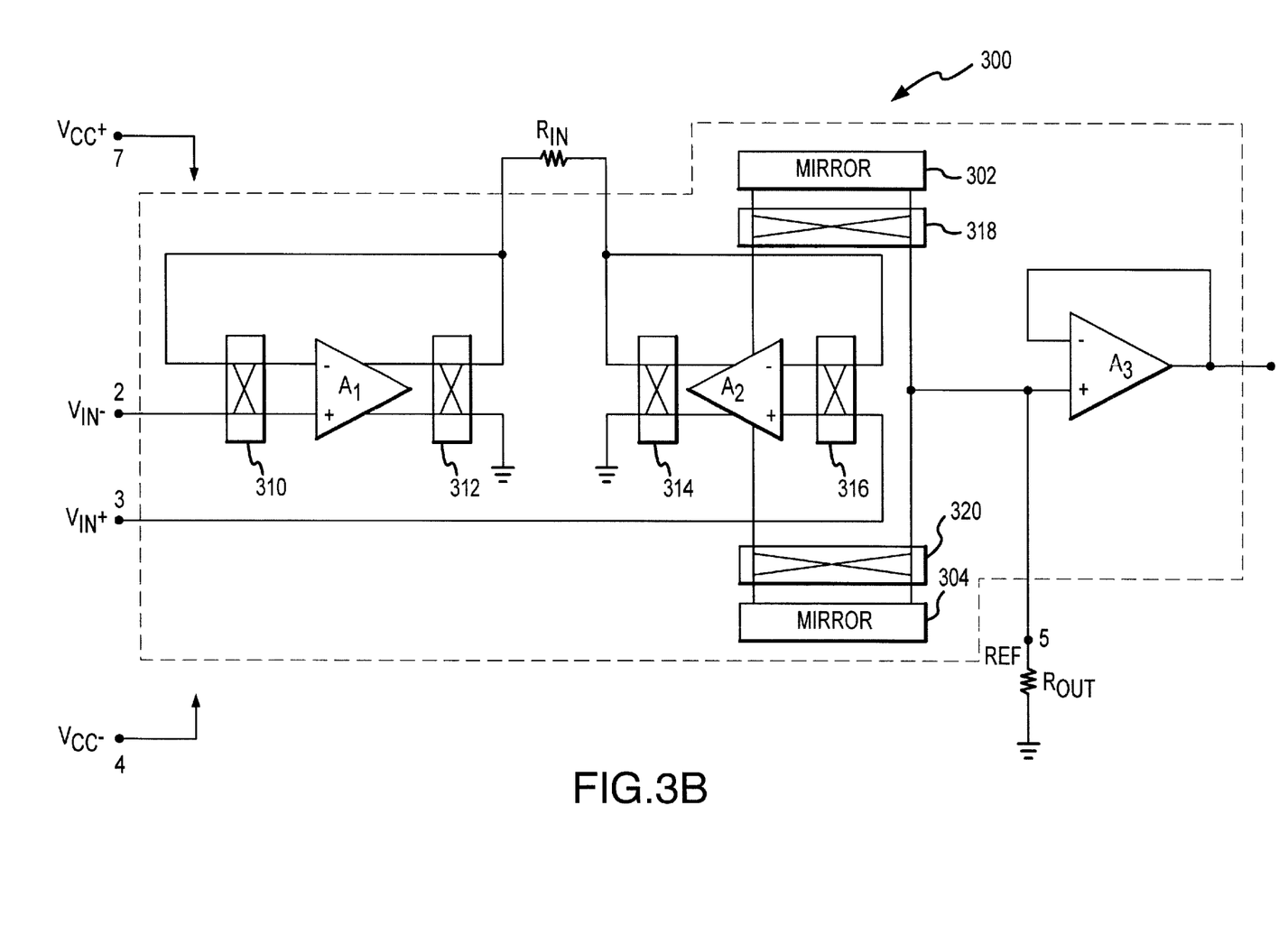

In accordance with another aspect of the present invention, while unity gain buffers 502 and 508 can comprise various configurations, instrumentation amplifier 500 can be suitably configured with chopper stabilized amplifiers for buffers 502 and 508, and/or for output buffer 520 if utilized. As a result, buffers 502 and 508 and/or output buffer 520 can be configured to address offset and drift errors, as well as further improve the CMR. In accordance with this aspect, the chopper stabilized amplifiers can comprise any conventional chopper amplifier or any auto-zero configuration and the like now known or hereinafter devised. For example, with momentary reference to FIG. 3B, buffers $A_1$ and $A_2$ can be configured with chopper blocks 310, 312, 314 and 316.

As discussed above, currently available instrumentation amplifiers have great difficulty in providing the capability for large voltage swing at the input terminal. However, in accordance with another aspect of the present invention, an instrumentation amplifier can be provided which facilitates rail-to-rail voltage swing at the input, output and/or reference terminals.

In accordance with this aspect of the present invention, an instrumentation amplifier suitably includes a pair of charge pumps which are configured to provide supply voltage to the buffers and/or the current mirrors of the instrumentation amplifier. The pair of charge pumps suitably comprise a positive charge pump and a negative charge pump. For example, with reference to FIG. 3, a positive charge pump can be configured to provide an additional charged pumped positive supply voltage, such as ($V_{cc}^+$ plus 2 Volts), to buffer $A_1$, buffer $A_2$, and current mirror 302, while a negative charge pump can be configured to provide an additional charged pumped negative supply voltage, such as ($V_{cc}^-$ minus 2 Volts), to buffer $A_1$, buffer $A_2$, and current mirror 304. As a result, the input, reference, and output voltage levels at terminal 5 can suitably swing to or beyond the supply rails.

In accordance with another exemplary embodiment, with reference again to FIG. 5, instrumentation amplifier 500 can be suitably configured with a positive charge pump 522 and a negative charge pump 524. In accordance with this embodiment, the input stages of buffers 502 and 508 can be suitably biased from positive charge pump 522 and/or negative charge pump 524, respectively, thus allowing for an input voltage range beyond the supply voltages $V_{cc}+$ and $V_{cc}-$. For example, for a system supply voltage of 5 volts, wherein $V_{cc}+$ equals five (5) volts and $V_{cc}$ –equals zero (0) volts, e.g., ground, then the charged pumped positive supply can be seven (7) volts and the charged pumped negative supply can be negative two (–2) volts. In addition, positive charge pump 522 is suitably configured to provide the charged pumped positive supply voltage to current mirrors 512 and 516, while negative charge pump 524 is suitably configured to provide the charged pumped negative supply voltage to current mirrors 514 and 518. Accordingly, the input and reference voltage levels can suitably swing to or beyond the supply rails.

In addition, output buffer 520 can also be configured with an output stage biased from the supply voltages $V_{cc}+$ and $V_{cc}-$ so as to draw current directly from the supply voltage rails, or from the charge pumps 522 and 524. Output buffer 520 can be configured to suitably swing close to its supply rails, e.g., within a 100 mV of its supply rails. As a result, the input, output and/or reference voltage terminals can suitably swing proximate to or beyond the supply rails.

In addition, positive charge pump 522 and a negative charge pump 524 can be configured in various manners, for example, in a conventional double phase or current driven mode. Accordingly, charge pumps 522 and 524 can be configured in various arrangements, including any change pump device now known or hereinafter devised that can suitably provide a charged pumped supply voltage to facilitate an instrumentation amplifier in allowing for the input, output and reference terminals to suitably swing to or beyond the supply rails.

In accordance with yet another exemplary embodiment of the present invention, instrumentation amplifier 500 can be suitably configured such that only the supply current from output stages 505 and 511 of buffers 502 and 508 is suitably provided to current mirrors 512, 514, 516 and 518, i.e., the supply current from op amp stages 504 and 510 is not fed into current mirrors 512, 514, 516 and 518. Accordingly, instrumentation amplifier 500 can be suitably configured to further limit errors occurring at lower level signals, such as noise and input offset voltage (Vos) by reducing quiescent current through current mirrors 512, 514, 516 and 518. In addition, in accordance with this embodiment, instrumentation amplifier 500 can be suitably configured to reduce the quiescent current demanded from charge pumps 522 and 524.

In summary, the various exemplary embodiments of an instrumentation amplifier according to the present invention address many of the shortcomings of the prior art. In accordance with one aspect of the present invention, an instrumentation amplifier can be provided which can provide high common mode rejection without the use of precision resistors. In addition, the instrumentation amplifier can be configured in an 8-pin layout, such as, for example, for an MSOP-8 or SO-8 surface mount package. In accordance with another aspect of the present invention, an instrumentation amplifier can be provided which can effectively cancel the differential current mode signal created by common-mode input signals, such as caused by parasitic capacitances and the like which are detrimental to AC common mode rejection. In accordance with an exemplary embodiment, an instrumentation amplifier can comprise two pairs of current mirrors configured with two buffers to suitably add the differential current-mode signals and subtract the common current-mode signals of each buffer to thereby cancel the differential current mode signal created by common mode input signals from the parasitic capacitances within the instrumentation amplifier. In addition, the buffers and current mirrors can also be chopper stabilized to further enhance the operation of the instrumentation amplifier. In accordance with yet another aspect of the present invention, an instrumentation amplifier can be configured to provide rail-to-rail voltage swing capabilities at the input, output or reference voltages by including a pair of charge pumps which are configured to provide supply voltage to the buffers and current mirrors.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by providing other pin layouts or arrangements, and/or additional or fewer current mirrors or charge pumps. Further, an instrumentation amplifier can also include a negative and/or a positive regulator which are suitably configured to limit, filter or otherwise regulate the internal supply rails. In addition, for embodiments including chopper stabilized buffers or current mirrors, the devices can be configured to operate at various frequencies and other operating parameters. Moreover, the instrumentation amplifiers can be configured to aid the summation of multiple channels or for mixing, current-mode referencing, or signal processing applications and the like. These alternatives can be suitably selected depending upon the particular application or in consideration of any number of factors associated with the operation of the system. Moreover, these and other changes or modifications are intended to be included within the scope of the present invention, as expressed in the following claims.

What is claimed is:

1. An instrumentation amplifier configured for providing high common mode rejection, said instrumentation amplifier comprising:
    a pair of buffers configured to receive a differential input voltage;
    an external gain setting configuration comprising an input resistor, said input resistor being connected between said pair of buffers and configured to create a differential current mode signal by said pair of buffers;
    a first pair of current mirrors configured with one of said pair of buffers to mirror the differential current mode signal; and
    a second pair of current mirrors configured with a second of said pair of buffers; and
    wherein said first pair of current mirrors and said second pair of current mirrors are configured to cancel any differential current mode signal created by common mode input signals received at inputs of said pair of buffers.

2. An instrumentation amplifier according to claim 1, wherein said instrumentation amplifier further comprises an output buffer and an output resistor, said output buffer configured to receive the differential current mode signal from said first pair of current mirrors and said second pair of current mirrors and provide an output voltage, said output resistor being coupled to an input stage of said output buffer.

3. An instrumentation amplifier according to claim 1, wherein each of said first pair of current mirrors and said second pair of current mirrors are chopper stabilized.

4. An instrumentation amplifier according to claim 1, wherein each of said pair of buffers are chopper stabilized.

5. An instrumentation amplifier according to claim 1, wherein said instrumentation amplifier further comprises a pair of charge pumps configured to provide supply voltage to said buffers and said first pair of current mirrors and said second pair of current mirrors to facilitate rail-to-rail voltage swing for at least one of an input, an output and a reference terminal of said instrumentation amplifier.

6. An instrumentation amplifier according to claim 2, wherein said external gain setting further comprises an adjustable output reference coupled to said output resistor at said input stage of said output buffer.

7. An instrumentation amplifier according to claim 2, wherein said external gain setting comprises an output filtering configuration at said input stage of said output buffer including an external capacitor configured in a parallel arrangement with said output resistor.

8. An instrumentation amplifier according to claim 2, wherein said external gain setting comprises an offsetting output configuration at said input stage of said output buffer including a second external resistor configured in a voltage dividing arrangement with said output resistor and an external voltage reference.

9. An instrumentation amplifier configured for providing high AC and DC common mode rejection, said instrumentation amplifier comprising:
    a pair of buffers configured to receive a differential input voltage;
    an input resistor being connected between said pair of buffers; and
    two pairs of current mirrors comprising a first pair and a second pair configured to add a differential current mode signal provided from each of said pair of buffers, wherein said two pairs of current mirrors operate to cancel any differential current mode signal created by common mode input signals.

10. An instrumentation amplifier according to claim 9, wherein said instrumentation amplifier further comprises an output buffer configured to receive a combined current mode signal from said first pair and said second pair of current mirrors and provide an output voltage.

11. An instrumentation amplifier according to claim 9, wherein each of said two pairs of current mirrors are chopper stabilized.

12. An instrumentation amplifier according to claim 9, wherein each of said pair of buffers are chopper stabilized.

13. An instrumentation amplifier according to claim 9, wherein said instrumentation amplifier further comprises a pair of charge pumps configured to provide supply voltage to at least one of said buffers and said two pairs of current mirrors to facilitate rail-to-rail voltage swing for at least one of an input, an output and a reference terminal of said instrumentation amplifier.

14. An instrumentation amplifier according to claim 9, wherein each of said pair of buffers comprises an op amp stage and an output stage, and wherein instrumentation amplifier is configured such that only supply current from said output stages of said pair of buffers is provided to said pair of current mirrors to further limit errors occurring a low level signals.

15. An instrumentation amplifier configured for providing high common mode rejection, said instrumentation amplifier comprising:
    a pair of buffers configured to receive a differential input voltage;
    an input resistor being connected between said pair of buffers and configured to create a differential current mode signal by said pair of buffers;

a first pair of current mirrors configured with one of said pair of buffers to mirror the differential current mode signal, wherein said instrumentation amplifier is configured with chopper stabilization in said first pair of current mirrors to reduce gain and drifting errors and to improve linearity in said first pair of current mirrors.

16. An instrumentation amplifier according to claim 15, wherein said instrumentation amplifier further comprises an output buffer configured to receive the mirrored differential current mode signal from said first pair of current mirrors and provide an output voltage.

17. An instrumentation amplifier according to claim 15, wherein said instrumentation amplifier comprises a second pair of current mirrors configured with a second of said pair of buffers to cancel any differential current mode signal created by common mode input signals received at inputs of said pair of buffers, and wherein said second pair of current mirrors are chopper stabilized.

18. An instrumentation amplifier according to claim 15, wherein each of said pair of buffers are chopper stabilized.

19. An instrumentation amplifier according to claim 17, wherein said instrumentation amplifier further comprises an output buffer configured to receive the mirrored differential current mode signal from said first pair of current mirrors and provide an output voltage.

20. An instrumentation amplifier according to claim 16, wherein said instrumentation amplifier further comprises an external gain setting configuration comprising said input resistor and an output resistor, said output resistor coupled to an input stage of said output buffer.

21. An instrumentation amplifier configured for providing high common mode rejection, said instrumentation amplifier comprising:
    a pair of buffers configured to receive a differential input voltage;
    an input resistor being connected between said pair of buffers and configured to create a differential current mode signal by said pair of buffers;
    a first pair of current mirrors configured with one of said pair of buffers to mirror the differential current mode signal and a second pair of current mirrors configured with a second of said pair of buffers to cancel any differential current mode signal created by common mode input signals received at inputs of said pair of buffers; and
    a pair of charge pumps configured to provide supply voltage to said buffers and said first pair of current mirrors to facilitate rail-to-rail voltage swing for at least one of an input, an output and a reference terminal of said instrumentation amplifier.

22. An instrumentation amplifier according to claim 21, wherein said pair of charge pumps comprises a positive charge pump and a negative charge pump.

23. An instrumentation amplifier according to claim 21, wherein said pair of charge pumps are configured to bias an input stage for each of said pair of buffers to facilitate an input voltage swing beyond a level of supply voltages.

24. An instrumentation amplifier according to claim 21, wherein said instrumentation amplifier further comprises an output buffer configured to receive the mirrored differential current mode signal from said first pair of current mirrors and provide an output voltage.

25. A method for obtaining high common mode rejection in an instrumentation amplifier, said method comprising the steps of:
    receiving a differential input signal in a pair of buffers of the instrumentation amplifier;
    summing differential current mode signals provided from said pair of buffers with a first pair of current mirrors and a second pair of current mirrors;
    subtracting common current mode signals provided said pair of buffers; and
    canceling with said first pair of current mirrors and said second pair of current mirrors a differential mode signal created by said common mode input signals to cancel out parasitic capacitances within said instrumentation amplifier.

26. The method according to claim 25, wherein said method further comprises the steps of:
    receiving said differential current mode signal from said first pair of current mirrors and said second pair of current mirrors; and
    providing an output voltage from said output buffer.

27. A method for providing high AC and DC common mode rejection in an instrumentation amplifier, said method comprising the steps of:
    receiving a differential input signal in a pair of input buffers;
    creating a differential mode signal in said pair of input buffers through an input resistor connected between said pair of input buffers;
    mirroring said differential mode signal from said pair of buffers through a first pair of current mirrors and a second pair of current mirrors; and
    canceling any differential current mode signal created by common mode input signals received at inputs of said pair of buffers.

28. The method according to claim 27, wherein said method further comprises steps of:
    receiving a combined current mode signal from said first pair of current mirrors and said second pair of current mirrors; and
    providing an output voltage from said output buffer.

* * * * *